(12) United States Patent
Kostiew

(10) Patent No.: US 7,367,486 B2
(45) Date of Patent: May 6, 2008

(54) SYSTEM AND METHOD FOR FORMING SOLDER JOINTS

(75) Inventor: George Kostiew, Macungie, PA (US)

(73) Assignee: Agere Systems, Inc., Allentown, PA (US)

( * ) Notice: Subject to any disclaimer, the term of this patent is extended or adjusted under 35 U.S.C. 154(b) by 325 days.

(21) Appl. No.: 10/955,912

(22) Filed: Sep. 30, 2004

(65) Prior Publication Data

US 2006/0065696 A1    Mar. 30, 2006

(51) Int. Cl.
 B23K 1/06    (2006.01)
 B23K 31/02   (2006.01)

(52) U.S. Cl. .............. 228/110.1; 228/180.22; 228/245

(58) Field of Classification Search .............. None
See application file for complete search history.

(56) References Cited

U.S. PATENT DOCUMENTS

| | | | |
|---|---|---|---|
| 5,154,338 A | | 10/1992 | Okuno et al. |
| 5,409,155 A | * | 4/1995 | Chen ................... 228/6.2 |
| 5,607,609 A | | 3/1997 | Sakuyama et al. |
| 5,715,592 A | * | 2/1998 | Mori et al. .............. 29/762 |
| 6,053,395 A | * | 4/2000 | Sasaki ................ 228/180.22 |
| 6,146,448 A | | 11/2000 | Shaw et al. |
| 6,561,407 B2 | | 5/2003 | Nagafuku et al. |
| 6,776,325 B2 | | 8/2004 | Yang |
| 6,798,072 B2 | | 9/2004 | Kajiwara et al. |
| 6,871,776 B2 | * | 3/2005 | Trucco .................. 228/234.1 |
| 6,969,915 B2 | * | 11/2005 | Tago et al. ............. 257/781 |
| 2004/0161865 A1 | | 8/2004 | Yu et al. |
| 2006/0091184 A1 | * | 5/2006 | Bayot et al. .......... 228/110.1 |

FOREIGN PATENT DOCUMENTS

| | | | |
|---|---|---|---|
| JP | 60-180664 | * | 9/1985 |
| JP | 362217638 A | * | 9/1987 |
| JP | 08181142 A | * | 7/1996 |

OTHER PUBLICATIONS

Translation of JP-08181142.*

* cited by examiner

*Primary Examiner*—Kiley Stoner

(57) ABSTRACT

Disclosed herein are methods and devices for stimulating soldering of a substrate with a component during a reflow process. In an exemplified embodiment, the method involves placing a substrate/component combination into a reflow oven; directing the substrate/component combination to the heating zone of said reflow oven; and vibrating the substrate/component combination while said substrate/component combination is in said heating zone. The vibrating of the substrate/component combination occurs at a predetermined amplitude and frequency such that formation of a complete solder joint is stimulated without displacing said substrate and said component relative to each other.

7 Claims, 3 Drawing Sheets

SYSTEM AND METHOD FOR FORMING SOLDER JOINTS

BACKGROUND OF THE INVENTION

Surface mount electronic assembly generally requires an oven reflow process in order to bond components to printed circuit boards or bumped dies to substrates. One common failure mode with this process is what is known as cold solder joints or "non-wets" where the solder on the component does not form a solder joint with the substrate or printed circuit board. This requires expensive and manual repair or loss or materials if repair is not possible. In flip chip assembly, this failure mode is a direct yield impact and results in 100 percent material scrap as once the device is fully assembled, it cannot be repaired. Typically, in a reflow soldering apparatus, a circuit board and electronic components are heated, thereby melting a solder to join the circuit board and electronic components by the solder. Typically, it is necessary to use high activation fluxes which require post process cleaning and are generally more expensive. High activation flux and cleaning is an added expense and process that requires additional inspection and baking of the device. Other attempts to adjust the problem of cold solder joints include using multiple reflows. Multiple reflows adds to the process cycle time and unnecessarily stresses the devices. In addition, this does not completely eliminate cold solder joints and human error can be introduced into the process, as devices may be reflowed more than desired.

BRIEF DESCRIPTION OF THE DRAWINGS

FIG. 4 shows a side view of another embodiment of the subject invention.

DETAILED DESCRIPTION

The subject invention is based on the inventors' discovery that the use of controlled vibration during reflow mechanically assists in the oxide separation commonly formed on solder balls interposed between a substrate and component, and therefore stimulates the complete soldering of the substrate and electrical component. In one embodiment, the subject invention relates to a mechanical or electromechanical device integrated into a reflow oven such that it vibrates the substrate/component combination as it travels on the conveyor, or similar means, for directing a substrate/component through a tunnel of typical reflow ovens. The vibrating device is designed such that it vibrates as the component/substrate combination travels in the heat zone where the solder is molten. Preferably, the vibrating device is capable of adjusting the frequency and amplitude of the vibration as well as withstanding high temperatures.

The vibrating device may take any form of a mechanical or electromechanical device known in the arts to achieve vibration. Examples of suitable vibrating devices that may be used in accordance with the teachings herein include, but are not limited to, gyroscopes, pizeolectric cells, eccentric-cam devices, and oscillating air diaphragm devices. The vibrating should be robust enough to withstand the temperatures produced in reflow ovens to induce molten solder. Alternatively, the vibrating device may be encased in an insulating material to assist the vibrating in withstanding soldering temperatures.

Figure 1:
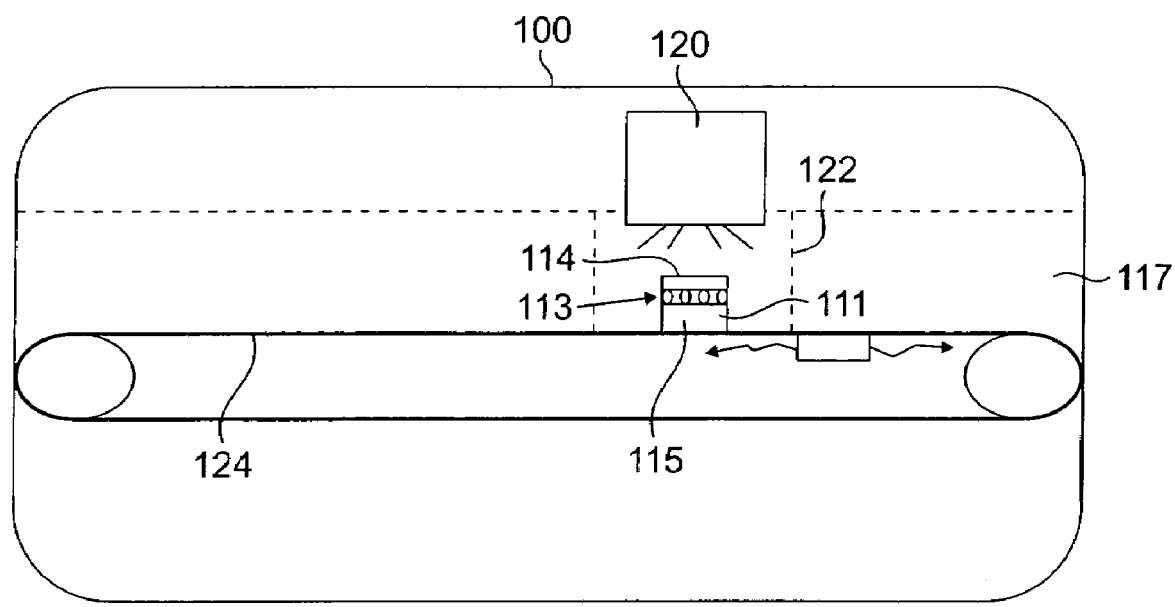
FIG. 1 shows a side schematic of a reflow oven equipped with a vibrating device according to one embodiment of the subject invention.

Turning to the figures, FIG. 1 illustrates a schematic of a conventional reflow oven 100 comprising a transfer conveyor 124. The substrate/component combination 115 is put onto the conveyor 124 which directs the substrate/component combination 115 through a tunnel 117 defined in the oven 100 to the heat zone, designated as dash lines 122 of the reflow oven 100. As contemplated herein, the substrate/component combination comprises solder disposed between a substrate and component. With respect to the embodiment shown in FIG. 1, the substrate component combination 115 comprises a substrate 111, solder 113, and a component 114. Typically, the solder is disposed as bumps positioned relative to said substrate and component so as to form a connection between a pad or lead on the component and a pad or lead on the substrate upon melting during the reflow process. Heat is produced by conventional heating device 120 which delivers heat at the heat zone 122. Attached to or integrated with the transfer conveyor 124 is a vibrating device 110. Based on the location of the substrate/component combination 115, or some other conditions such as a predetermined time or temperature, the vibrating device 110 begins vibrating at a controlled frequency and amplitude such that the conveyor 124, and thus the substrate/component combination 115, also vibrate. The vibration caused by the vibrating device 110 is optimized such that upon vibration, the solder balls between the substrate and component collapse thereby forming a robust electrical connection. The vibration acts to mechanically break up oxidation that typically tends to form on the solder, and therefore alleviates the need for utilizing highly reactive and corrosive fluxes with the solder. FIG. 1 shows the vibrating device 110 attached to or integrated with the transfer conveyor 124. The positioning of the vibrating device 110 may vary depending on the optimum placement to effect the collapse of the solder without displacing the substrate and component from each other, which would create other problems. Those skilled in the art, in combination with the teachings herein, would be able to determine optimum placement of the vibrating device on the transfer conveyor.

Figure 2:
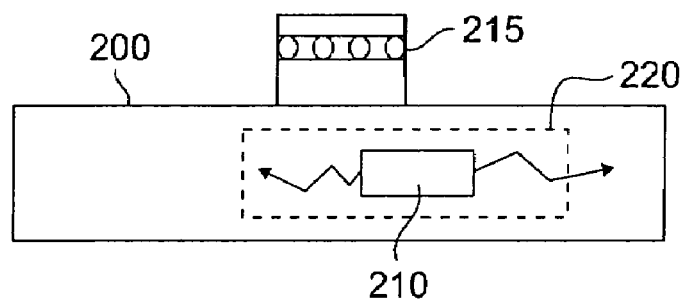
FIG. 2 shows a side view of a carrier equipped with a vibrating device for use in reflow ovens according to another embodiment of the subject invention.

FIG. 2 shows a carrier embodiment 200 designed for use in connection with conventional chain belt conveyors in reflow ovens. The carrier 200 has disposed within a portion thereof a vibrating device 210. The carrier 200 is designed for carrying substrate/component combinations through reflow ovens in executing the reflow process. The vibrating device may be encased in an insulating material, or alternatively, the carrier 200 may comprise an insulating material that shields the vibrating device 210 from the elevated temperatures in the reflow oven.

Figure 3:
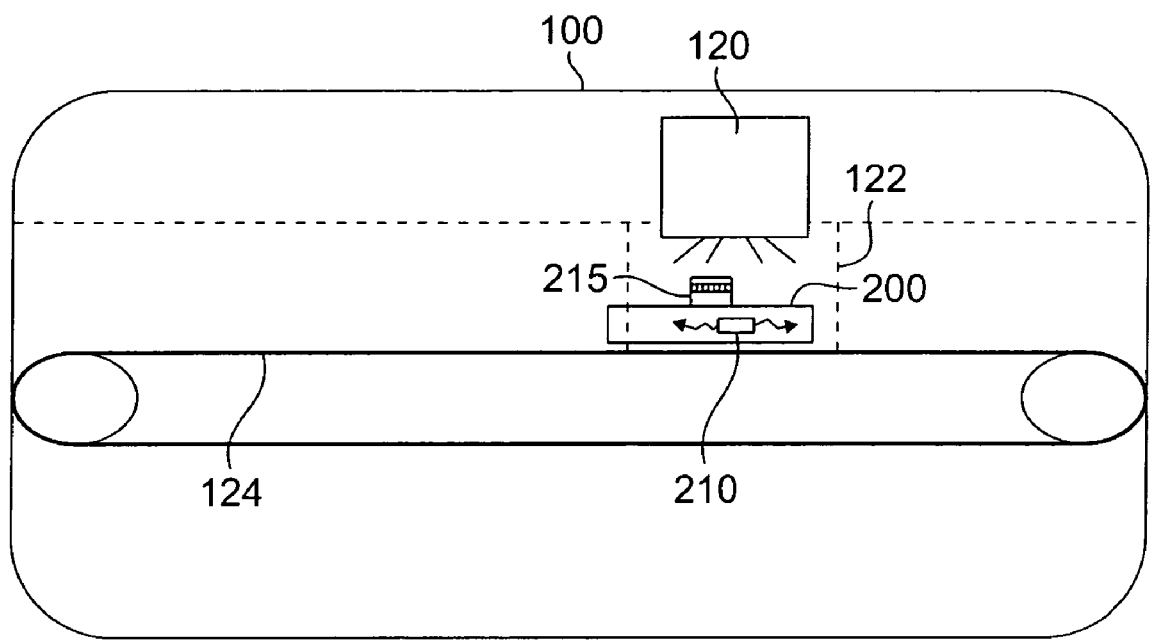
FIG. 3 shows a schematic demonstrating the use of the carrier shown in FIG. 2.

FIG. 3 demonstrates the use of the carrier embodiment 200 shown in FIG. 2. The carrier 200 is positioned on the transfer conveyor 124 in the reflow oven 100. The transfer conveyor 124 moves the carrier 200 with a substrate/component combination 215 situated in the carrier through the tunnel 117 of the reflow oven 100. Based on predetermined conditions, such as a predetermined time, location or temperature, the vibrating device 210 attached to or integrated on the carrier 200 begins to vibrate at a controlled frequency and amplitude. This occurs while the substrate/component combination 215 is directed through the heating zone 122 with the heat provided by the heating device 120.

Figure 4A:
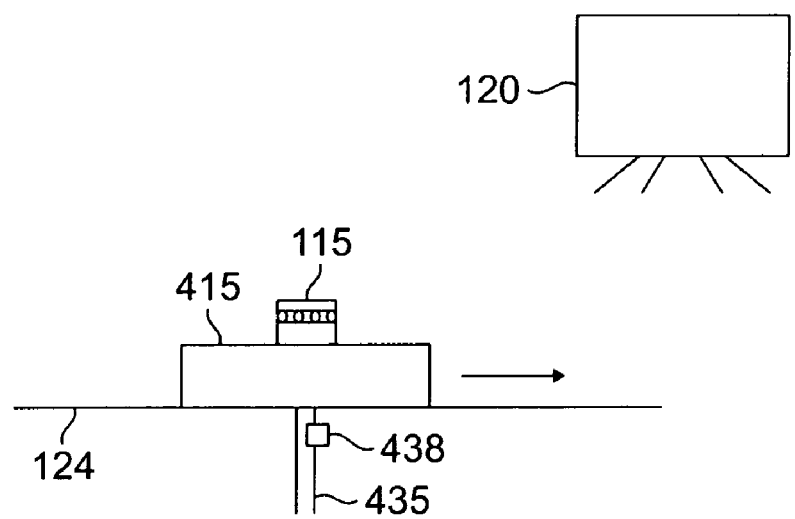
FIG. 4a shows a first position wherein a platform embodiment is in a retracted state and FIG. 4b shows a position wherein the platform embodiment is in a raised state. The platform is equipped with a vibrating device.
Figure 4B:
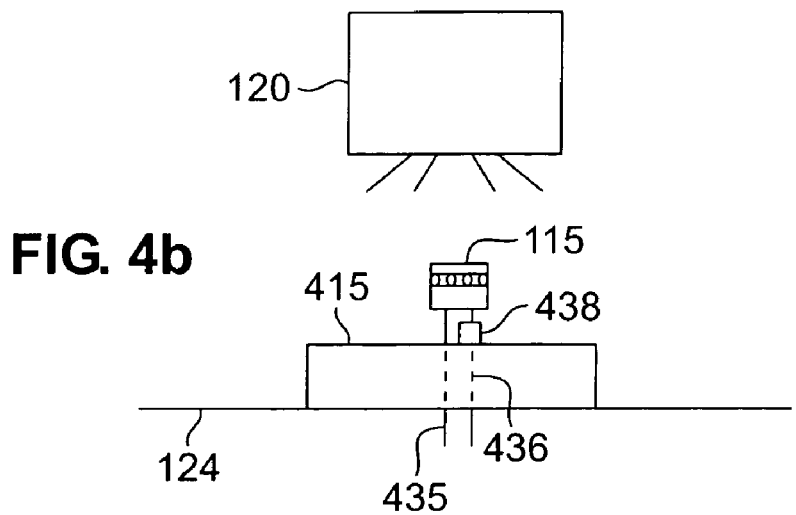

FIGS. 4A and B illustrate another embodiment of the subject invention for vibrating a substrate/component combination 115 during the reflow process. According to this embodiment, a carrier 415 is placed on a transfer conveyor 124 of a reflow oven. A pneumatic platform 435 is mechanically engaged to the transfer conveyor 124 such that the pneumatic platform 435 travels along with the transfer conveyor 124 at the same speed as the conveyor 124. The engagement of the pneumatic platform 435 and the conveyor 124 may take multiple forms such as a conveyor within a conveyor belt pulley system interlinked with the transfer conveyor 124, as is commonly used in industrial/manufacturing processes, or other suitable mechanical means as will be readily appreciated by those skilled in the art. Alternatively, the pneumatic platform 435 may run on a separate track that is designed to run along with the transfer conveyor 124, but is not interlinked to the transfer conveyor 124. At a certain point in the reflow process, the pneumatic platform raises up through an opening (depicted as dashed lines 436) in the carrier 415. The pneumatic arm 435 engages the substrate/component combination 115 and the vibrating device 438 is actuated. As described above, the vibrating device vibrates at a predetermined amplitude and frequency suitable to mechanically break up oxidation on the solder and assist the collapse of the solder balls interposed between the substrate and component. After a predetermined time of vibrating by the vibrating device 438, the pneumatic arm 435 retracts thereby repositioning the substrate/component combination 115 in the carrier 415.

Figure 5:
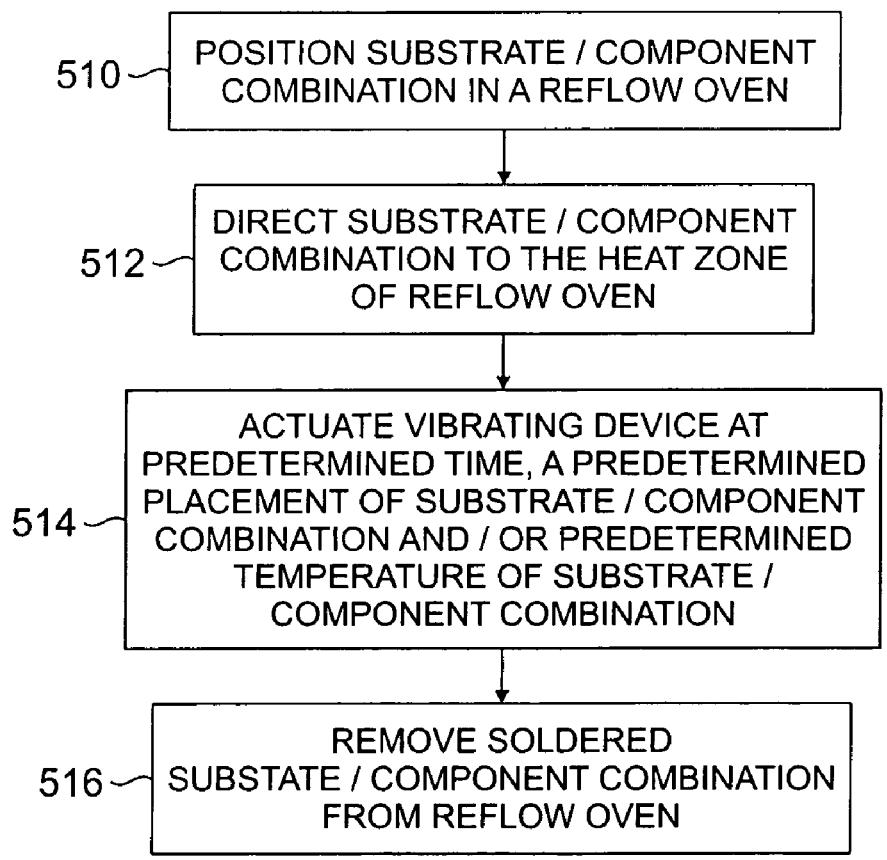
FIG. 5 shows a flow diagram representing a method embodiment of the subject invention.

FIG. 5 is a flow diagram according to a method embodiment of the subject invention. In a first step 510 a substrate/component combination is positioned onto a conveyor belt and a reflow oven. As discussed above, substrate/component combination may be placed onto a conveyor belt directly or via a carrier system which engages a conveyor chain belt system. Next the substrate/component combination is directed to a heat zone of the reflow oven (step 512). A vibrating device vibratingly associated with the substrate/component combination is actuated at a predetermined time in the reflow process or a predetermined placement of the substrate/component combination in the reflow oven, or upon a predetermined temperature of the substrate/component combination (step 514). The term vibratingly associated, as used herein, refers to a mechanical association wherein the substrate/component sympathetically responds to the vibration produced by the vibrating device. After the successful soldering of the substrate/component combination takes place, the combination is removed from the reflow oven (step 516).

While the preferred embodiments of the present invention have been shown and described herein in the present context, it will be obvious that such embodiments are provided by way of example only and not of limitation. Numerous variations, changes and substitutions will occur to those of skilled in the art without departing from the invention herein. For example, the present invention need not be limited to best mode disclosed herein, since other applications can equally benefit from the teachings of the present invention. Accordingly, it is intended that the invention be limited only by the spirit and scope of the appended claims.

U.S. Pat. Nos. 5,154,338; and 6,561,407 are cited for background information concerning reflow ovens and the reflow soldering process. These references are incorporated herein in their entirety to the extent they are not inconsistent with the teachings herein.

What is claimed is:

1. A method of forming a solder joint between a substrate and a component comprising solder disposed therebetween, said method comprising:

providing a carrier comprising a vibrating device;

placing a substrate and a component together to form a substrate/component combination, and putting the substrate/component onto the carrier;

placing the carrier with the substrate/component into the reflow oven;

directing the carrier with said substrate/component combination to a heating zone of said reflow oven; and causing the vibrating device to vibrate at a predetermined time, at a predetermined temperature or at a predetermined position in the reflow oven, or a combination thereof, to vibrate said substrate/component combination while said substrate/component combination is in said heating zone, wherein said vibrating occurs at a predetermined amplitude and frequency such that formation of a complete solder joint is encouraged without displacing said substrate and said component relative to each other, wherein said vibrating of said substrate/component combination is adapted to cause a ball of solder between said substrate and said component to collapse.

2. The method of claim 1, wherein said carrier is designed to engage a transfer conveyer comprised within said reflow oven.

3. The method of claim 1, wherein said substrate/component combination comprises interposing solder balls between said substrate and said component.

4. The method of claim 1, wherein said substrate is a printed circuit board.

5. The method of claim 1, wherein said component is a semiconductor device.

6. A method of forming a solder joint between a substrate and a component comprising solder disposed therebetween, said method comprising:

placing a substrate and a component together to form a substrate/component combination, and placing the substrate/component into a reflow oven, wherein said reflow oven comprises a platform designed for engaging said substrate/component combination, said platform comprising a vibrating device that vibrates at a predetermined time in the reflow process, or at a predetermined temperature or predetermined position in the reflow oven, said platform moving with said substrate/component through said reflow oven;

directing said substrate/component combination to a heating zone of said reflow oven; and causing said vibrating device to move with said substrate/component through said reflow oven and vibrate said substrate/component combination while said substrate/component combination is in said heating zone, wherein said vibrating occurs at a predetermined amplitude and frequency such that formation of a complete solder joint is encouraged without displacing said substrate and said component relative to each other, and wherein said vibrating of said substrate/component combination is adapted to cause a ball of solder between said substrate and said component to collapse.

7. The method of claim 6, wherein said platform pneumatically engages said substrate/component combination.

* * * * *